United States Patent
Zhao et al.

(10) Patent No.: US 11,624,780 B2
(45) Date of Patent: *Apr. 11, 2023

(54) SYSTEM AND METHOD FOR RECEIVER EQUALIZATION AND STRESSED EYE TESTING METHODOLOGY FOR DDR5 MEMORY CONTROLLER

(71) Applicant: Huawei Technologies Co., Ltd., Shenzhen (CN)

(72) Inventors: Gang Zhao, Chandler, AZ (US); Howard David, Portland, OR (US); Xusheng Liu, Shenzhen (CN); Yongyao Li, Chengdu (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 230 days.

This patent is subject to a terminal disclaimer.

(21) Appl. No.: 16/918,762

(22) Filed: Jul. 1, 2020

(65) Prior Publication Data
US 2020/0333396 A1    Oct. 22, 2020

Related U.S. Application Data

(63) Continuation of application No. PCT/US2019/018181, filed on Feb. 15, 2019, which
(Continued)

(51) Int. Cl.
| | |
|---|---|
| *G11C 29/00* | (2006.01) |
| *G01R 31/317* | (2006.01) |
| *G11C 29/02* | (2006.01) |
| *G11C 29/56* | (2006.01) |

(52) U.S. Cl.
CPC ... *G01R 31/3171* (2013.01); *G01R 31/31709* (2013.01); *G11C 29/022* (2013.01);
(Continued)

(58) Field of Classification Search
CPC .......... G01R 31/3171; G01R 31/31709; G11C 29/022; G11C 29/023; G11C 29/028; G11C 29/56008; G11C 29/56012; G11C 29/5602
See application file for complete search history.

(56) References Cited

U.S. PATENT DOCUMENTS

| | | | | |
|---|---|---|---|---|
| 6,388,259 B1 * | 5/2002 | Murdock | ................ | G01T 1/026 250/370.01 |
| 10,859,626 B2 * | 12/2020 | Zhao | .................... | G11C 29/022 |

(Continued)

OTHER PUBLICATIONS

Jedec, "Committee Letter Ballot, Proposed DDR5 SDRAM Loopback Pin Specification," Committee JC42.3B5, Committee Item No. 1830.92A,, Aug. 2011, 3 pages.
(Continued)

*Primary Examiner* — Christine T. Tu
(74) *Attorney, Agent, or Firm* — Slater Matsil, LLP

(57) ABSTRACT

A method for bit error rate testing a processing unit using a bit error rate tester (BERT) includes transmitting a signal pair to a receiver of the processing unit, the signal pair having jitter levels complying with a jitter threshold, tuning the signal pair to obtain a first stressed eye measurement for the receiver, wherein the first stressed eye measurement complies with a stressed eye mask, placing the processing unit into a loop-back mode, wherein data transmitted to the processing unit by the BERT is transmitted back to the BERT, transmitting a data pattern to the processing unit, receiving a looped back version of the data pattern from the processing unit, and calculating a bit error rate in accordance with the data pattern and the looped back version of the data pattern.

20 Claims, 11 Drawing Sheets

[TESTING]

Related U.S. Application Data is a continuation-in-part of application No. 16/039,945, filed on Jul. 19, 2018, now Pat. No. 10,859,626.

(60) Provisional application No. 62/633,421, filed on Feb. 21, 2018.

(52) U.S. Cl.
CPC .......... *G11C 29/023* (2013.01); *G11C 29/028* (2013.01); *G11C 29/56008* (2013.01); *G11C 29/56012* (2013.01); *G11C 2029/5602* (2013.01)

(56) References Cited

U.S. PATENT DOCUMENTS

| | | | |
|---|---|---|---|
| 2006/0165186 A1* | 7/2006 | Segaram | H04L 25/0292 375/257 |
| 2010/0229053 A1 | 9/2010 | Kushnick | |
| 2010/0332931 A1 | 12/2010 | Stephens et al. | |
| 2012/0072784 A1* | 3/2012 | Li | G06F 11/267 714/704 |
| 2015/0332735 A1 | 11/2015 | Chun et al. | |

OTHER PUBLICATIONS

Jedec, "Committee Letter Ballot, DDR5 Rx Stressed Eye Specification REV2," Committee JC42.3C, Comittee Item No. 1849.18, Aug. 2011, 4 pages.

Jedec, "Loopback presentation; Intel; Global Standards for the Microelectronics Industry," Aug. 2017, 4 pages.

Jedec, "Jedec Standard," DDR4 SDRAM. Standard No. JESD79-4A, Jedec Solid State Technology Association, Nov. 2013, 218 pages.

* cited by examiner (CALIBRATION)

CALIBRATION (BER TESTING)

SYSTEM AND METHOD FOR RECEIVER EQUALIZATION AND STRESSED EYE TESTING METHODOLOGY FOR DDR5 MEMORY CONTROLLER

PRIORITY CLAIM AND CROSS-REFERENCE

This application is a continuation of PCT Application No. PCT/US2019/018181, entitled "Receiver Equalization and Stressed Eye Testing System," filed Feb. 15, 2019, which is a continuation-in-part of U.S. application Ser. No. 16/039,945 now U.S. Pat. No. 10,859,626 issued Dec. 8, 2020, entitled "Receiver Equalization and Stressed Eye Testing System", filed Jul. 19, 2018, and claims the benefit of U.S. Provisional Application No. 62/633,421, entitled "A Receiver Equalization and Stressed Eye Testing Methodology for DDR5 Memory Controller", filed on Feb. 21, 2018, which applications are hereby incorporated herein by reference.

TECHNICAL FIELD

The disclosure generally relates to a system and method for electrical testing methodology for a DDR5 memory controller receiver.

BACKGROUND

The rapid growth in data center, cloud computing and artificial intelligence applications have spurred increasing demand for memory bandwidth and double data rate (DDR) interface speed in recent years. In 2018, the first generation of commercial synchronous graphics random-access memory (GDDR6) devices are being rolled out that increase the speed of memory devices to 10-14 Gb/s from 8 Gb/s. The JEDEC Solid State Technology Association fifth generation double data rate synchronous dynamic random-access memory (DDR5 SDRAM) specification for mainstream computation applications due to publish in the middle of 2018 is further expected to double the fourth-generation double data rate synchronous dynamic random-access memory (DDR4 SDRAM) speed to a new height of 6.4 Gb/s.

In support of the continuing increase of the DDR interface speed while still enabling a set of complex bus topologies, more and more transceiver equalization techniques that were traditionally designed for the high-speed serializer/deserializer (SerDes) interfaces were recently introduced to the parallel interface of the DDR5 SDRAM. These new features include the decision feedback equalization (DFE), the continuous time linear equalization (CTLE), and the feed forward equalization (FFE). A similar adoption of transceiver equalization techniques is expected on the controller side.

With the transceiver design technology of DDR5 SDRAM devices merging towards the aforementioned SerDes techniques, new testing methodologies are desired for DDR5 system board and memory controller devices that were traditionally used for SerDes interface devices, such as the receiver link equalization and stressed eye test. There is an urgent need to provide such testing systems and associated methods in anticipation of new DDR5 controller chips and SDRAM devices being provided to the market.

SUMMARY OF THE INVENTION

Various examples are now described to introduce a selection of concepts in a simplified form that are further described below in the Detailed Description. The Summary is not intended to identify key or essential features of the claimed subject matter, nor is it intended to be used to limit the scope of the claimed subject matter. The claimed subject matter is not limited to implementations that solve any or all disadvantages noted in the Background.

According to a first aspect, a method for bit error rate testing a processing unit using a bit error rate tester (BERT) is provided. The method includes transmitting, by the BERT, a signal pair to a receiver of the processing unit, the signal pair having jitter levels complying with a jitter threshold, tuning, by the BERT, the signal pair to obtain a first stressed eye measurement for the receiver, wherein the first stressed eye measurement complies with a stressed eye mask, placing, by the BERT, the processing unit into a loop-back mode, wherein data transmitted to the processing unit by the BERT is transmitted back to the BERT, transmitting, by the BERT, a data pattern to the processing unit, receiving, by the BERT, a looped back version of the data pattern from the processing unit, and calculating, by the BERT, a bit error rate in accordance with the data pattern and the looped back version of the data pattern.

In a first implementation form of the method according to the first aspect as such, further comprising comparing, by the BERT, the bit error rate with a bit error rate threshold, and determining, by the BERT, that the bit error rate is less than the bit error rate threshold, and based thereon, determining that the processing unit passed bit error rate testing.

In a second implementation form of the method according to the first aspect as such or any preceding implementation form of the first aspect, wherein the bit error rate threshold is specified by a fifth generation double data rate (DDR5) synchronous dynamic random access memory (SDRAM) technical standard.

In a third implementation form of the method according to the first aspect as such or any preceding implementation form of the first aspect, wherein tuning the signal pair comprises tuning a timing relationship between a first signal and a second signal of the signal pair to meet a worst-case timing threshold.

In a fourth implementation form of the method according to the first aspect as such or any preceding implementation form of the first aspect, wherein the worst-case timing threshold is specified by a DDR5 SDRAM technical standard, a design specification of the processing unit, or a design specification of a memory controller coupled to the processing unit.

In a fifth implementation form of the method according to the first aspect as such or any preceding implementation form of the first aspect, wherein tuning the signal pair further comprises injecting, by the BERT, noise to the first signal and the second signal until a nominal noise threshold is met.

In a sixth implementation form of the method according to the first aspect as such or any preceding implementation form of the first aspect, wherein the worst-case timing threshold is specified by a DDR5 SDRAM technical standard.

In a seventh implementation form of the method according to the first aspect as such or any preceding implementation form of the first aspect, wherein tuning the signal pair further comprises activating, by the BERT, one of a plurality of replica channels, determining, by the BERT, a second stressed eye measurement for the receiver and the activated replica channel, repeating the activating and the determining for remaining replica channels of the plurality of replica channels, and selecting, by the BERT, a replica channel associated with the second stressed eye measurement that most closely complies with, but does not exceed, the stressed eye mask.

In an eighth implementation form of the method according to the first aspect as such or any preceding implementation form of the first aspect, wherein the first signal comprises a data signal and the second signal comprises a data strobe signal.

In a ninth implementation form of the method according to the first aspect as such or any preceding implementation form of the first aspect, further comprising saving, by the BERT, BERT settings and continuous time linear equalization (CTLE) settings of the receiver after tuning the signal pair.

In a tenth implementation form of the method according to the first aspect as such or any preceding implementation form of the first aspect, further comprising:
performing, by the BERT, an equalization protocol; and
training, by the BERT, the receiver to obtain optimal CTLE settings.

In an eleventh implementation form of the method according to the first aspect as such or any preceding implementation form of the first aspect, wherein calculating the bit error rate comprises comparing, by the BERT, the data pattern with the looped back version of the data pattern, determining, by the BERT, that corresponding bits of the data pattern and the looped back version of the data pattern differs, and based thereon, incrementing an error count, and generating, by the BERT, the bit error rate in accordance with the error count and a number of bits in the data pattern.

In a twelfth implementation form of the method according to the first aspect as such or any preceding implementation form of the first aspect, wherein the jitter threshold and the stressed eye mask are specified by a DDR5 SDRAM technical standard, a design specification of the processing unit, or a design specification of a memory controller coupled to the processing unit.

According to a second aspect, a system for bit error rate testing a processing unit using a BERT is provided. The system includes an electrical validation board having data traces adapted to connect to a receiver of the processing unit and a transmitter of the processing unit, a calibration load board adapted to connect to the data traces of the electrical validation board to receive a data pattern with jitter and noise injected from the BERT for transmission to the processing unit and to transmit a looped back version of the data pattern back to the BERT for calculation of a bit error rate, and a measurement device adapted to connect to the data traces and to make stressed eye measurements.

In a first implementation form of the system according to the second aspect as such, wherein the data pattern is provided to the processing unit under test over data traces having varied lengths to provide different delay and inter-symbol interference effects.

In a second implementation form of the system according to the second aspect as such or any preceding implementation form of the second aspect, wherein the data traces of the electrical validation board have varied lengths.

According to a third aspect, a system for bit error rate testing a processing unit is provided. The system includes an electrical validation board having data traces adapted to connect to a receiver of the processing unit and a transmitter of the processing unit, a calibration load board adapted to connect to the data traces of the electrical validation board to receive a data pattern with jitter and noise injected from a tester for transmission to the processing unit and to transmit a looped back version of the data pattern back to the tester for calculation of a bit error rate, a non-transitory memory storage comprising instructions, and one or more processors of the tester in communication with the memory storage, the electrical validation board, and the calibration load board. The one or more processors execute the instructions to transmit a signal pair to the receiver of the processing unit, the signal pair having jitter levels complying with a jitter threshold, tune the signal pair to obtain a first stressed eye measurement for the receiver, wherein the first stressed eye measurement complies with a stressed eye mask, place the processing unit into a loop-back mode, wherein data transmitted to the processing unit by the tester is transmitted back to the tester, transmit a data pattern to the processing unit, receive a looped back version of the data pattern from the processing unit, and calculate a bit error rate in accordance with the data pattern and the looped back version of the data pattern.

In a first implementation form of the system according to the third aspect as such, wherein the one or more processors further execute the instructions to compare the bit error rate with a bit error rate threshold, and determine that the bit error rate is less than the bit error rate threshold, and based thereon, determining that the processing unit passed bit error rate testing.

In a second implementation form of the system according to the third aspect as such or any preceding implementation form of the third aspect, wherein the one or more processors further execute the instructions to tune a timing relationship between a first signal and a second signal of the signal pair to meet a worst-case timing threshold.

In a third implementation form of the system according to the third aspect as such or any preceding implementation form of the third aspect, wherein the one or more processors further execute the instructions to inject noise to the first signal and the second signal until a nominal noise threshold is met.

In a fourth implementation form of the system according to the third aspect as such or any preceding implementation form of the third aspect, wherein the one or more processors further execute the instructions to activate one of a plurality of replica channels, determine a second stressed eye measurement for the receiver and the activated replica channel, repeat the activating and the determining for remaining replica channels of the plurality of replica channels, and select a replica channel associated with the second stressed eye measurement that most closely complies with, but does not exceed, the stressed eye mask.

In a fifth implementation form of the system according to the third aspect as such or any preceding implementation form of the third aspect, wherein the one or more processors further execute the instructions to perform an equalization protocol, and train the receiver to obtain optimal CTLE settings.

In a sixth implementation form of the system according to the third aspect as such or any preceding implementation form of the third aspect, wherein the one or more processors further execute the instructions to compare the data pattern with the looped back version of the data pattern, determine that corresponding bits of the data pattern and the looped back version of the data pattern differs, and based thereon, incrementing an error count, and generate the bit error rate in accordance with the error count and a number of bits in the data pattern.

This disclosure is directed toward to a system and method for electrical testing methodology for the DDR5 memory controller receiver equalization and receiver (RX) stressed eye. It is a two-step approach, including a step of calibration and a step of bit error rate (BER) testing. It takes advantage of the existing industry infrastructures for the SerDes interface, such as the BERT, and adds new features that address the unique requirement of the DDR5 interface, such as testing crosstalk with multi-lane aggressing.

BRIEF DESCRIPTION OF THE DRAWINGS

Aspects of the present disclosure are illustrated byway of example and are not limited by the accompanying figures for which like references indicate elements.

DETAILED DESCRIPTION OF ILLUSTRATIVE EMBODIMENTS

Figure 1:
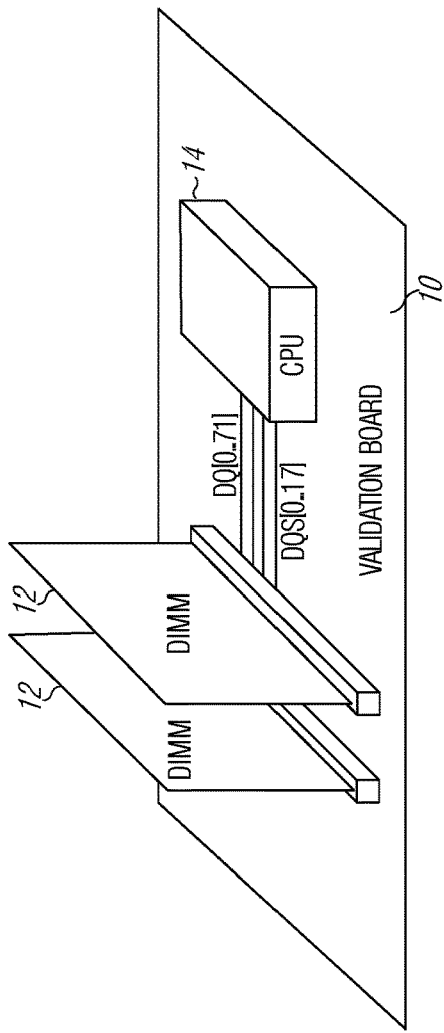
FIG. 1 illustrates conventional electrical testing for the fourth-generation double data rate (DDR4) dual in-line memory module (DIMM)/dynamic random-access memory (DRAM) interface using an electrical validation board (EVB).

It should be understood at the outset that although an illustrative implementation of one or more embodiments are provided below, the disclosed systems and/or methods described with respect to the figures presented herein may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents As shown in FIG. 1, conventional electrical testing for the fourth-generation double data rate (DDR4) dual in-line memory module (DIMM)/dynamic random-access memory (DRAM) interface 12 is often performed by an electrical validation board (EVB) 10. The bus topology of the EVB 10 is very similar to the customer reference board (CRB) in that it maintains similar trace lengths of the double data rate (DDR) bus and loading conditions with 2 DIMMs per channel.

The most widely adopted electrical testing method of the DDR4 DIMM/DRAM interface is the Rank Margining Test (RMT), which has been a proprietary methodology for the X86 server and PC systems. This test focuses on obtaining the boundary of the receiver stressed eye diagrams of the data signals. CPU 14 sweeps the voltage reference level (VREF) up and down to retrieve the eye height of the data, and sweeps the data signal in the time-domain by incrementing the delay line to get its eye width. Each X86 CPU vendor publishes a margin guideline of data eye width and eye height. The testing results that meet the eye width and height requirements are considered pass with low risk.

Although RMT testing has been very popular among system developers to quickly evaluate the DDR4 interface performance and risk, it faces inherent limitations to be further extended to fifth-generation double data rate (DDR5) electrical testing. First, it does not support bit error rate (BER) testing, which is becoming the new foundation of electrical testing for the DDR5 DRAM as being ratified by the JEDEC Solid State Technology Association. As noted above, BER testing has traditionally been a SerDes testing methodology, but BER testing is being introduced to the DDR5 specification due to the higher speed requirement. Second, the RMT testing benchmarks of the CPU receiver stressed eye depend heavily on many variables, including the DRAM silicon process corner, the DIMM manufacture corners and the mother board manufacture corners. As a result, the testing result varies significantly among individual systems and is not capable of providing a receiver stressed eye to reveal the CPU's inherent tolerance and capacity to timing and voltage stress, nor can it be used to test or validate the design target or design specifications. As will be explained below, both of these limitations are addressed and resolved by the testing systems and methods described herein.

Figure 2:
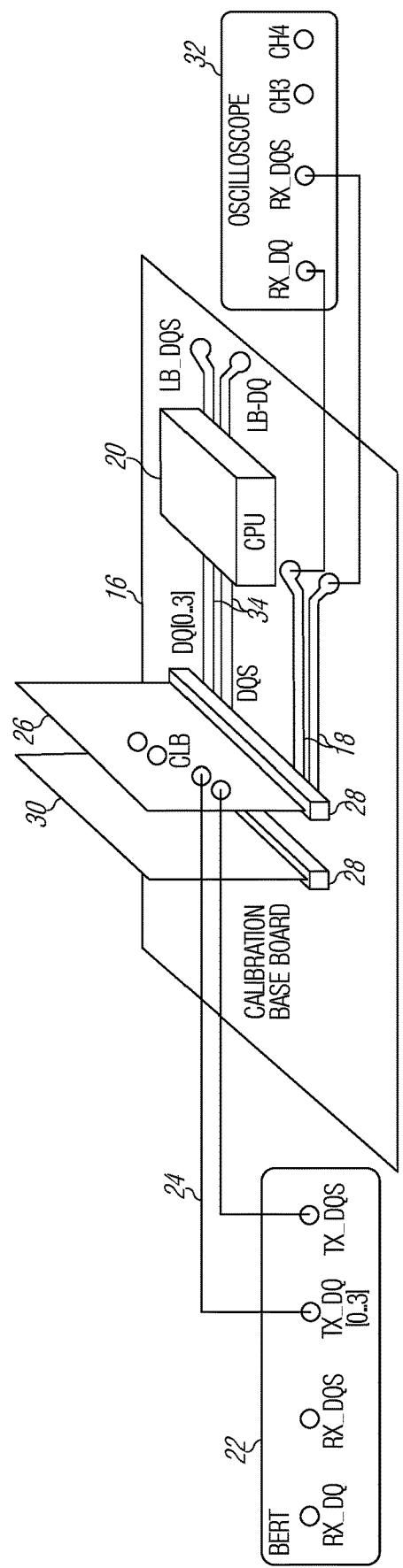
FIG. 2 illustrates a CPU receiver equalization testing setup for receiver calibration.
Figure 3:
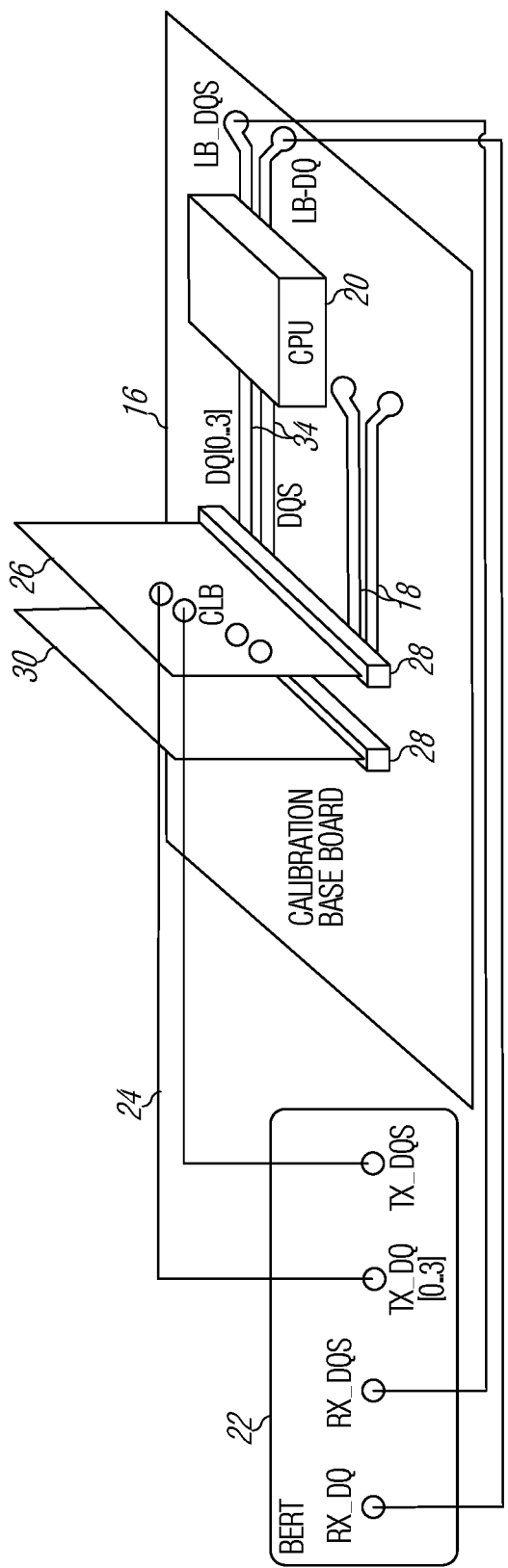
FIG. 3 illustrates a CPU receiver equalization testing setup for Bit Error Rate (BER) testing.

In sample embodiments, a system and method for receiver equalization and stressed eye testing is provided and the detailed testing flow is defined. The receiver equalization and stressed eye testing may be used for testing DDR5 memory controllers, for example. FIG. 2 and FIG. 3 illustrates a sample testing setup for receiver equalization and stressed eye testing of DDR5 memory controllers. As shown in FIG. 2 and FIG. 3 a customized calibration base board (CBB) 16 with replica channel 18 for each individual CPU chip set 20. The calibration base board 16 is different than the existing hardware of the EVB and the customer reference board (CRB), and a dedicated calibration base board 16 is used for every CPU chip 20 for which compliance tests are to be conducted.

As shown in FIG. 2 and FIG. 3, the bit error rate tester (BERT) 22 is used as the signal generator to drive and transmit DDR5 signals into the SubMiniature Version A (SMA) cable 24, which is connected to the calibration load board (CLB) 26. The transmit (TX) channel of the BERT 22 includes a minimum of one differential pair of TX_DQS (data strobe) signals, and four single-ended TX_DQ[0 . . . 3] data signals. This will be sufficient to test the x4 DDR5 interface including the crosstalk effect. Optionally, the BERT TX channel can be expanded to 8 single-ended signals including TX_DQ[0 . . . 7], plus the differential TX_DQS signals, in order to provide full testing capability for the x8 DDR5 interface. The BERT 22 also has receive channels including the RX_DQ and RX_DQS signals in order to support the loopback testing. The CLB 26 has the same pin-out as a standard DDR5 RDIMM, and is inserted into the DDR5 RDIMM connector sockets 28 on the CBB 16. A DDR5 DIMM card or dummy DIMM card 30 is inserted into a non-driving DIMM slot 28 to provide necessary termination and signal distortion to the transmit signals from the BERT 22. The testing and calibration should cover both cases where the CLB 16 is placed in the DIMM slot near the CPU 20 and the DIMM slot far from the CPU 20. To support the test of one DIMM per channel only, the DIMM slot near the CPU 20 is unpopulated and the CLB 26 is inserted into the slot far from the CPU 20.

For the calibration step using the setup of FIG. 2, the TX_DQ and TX_DQS signal buses are connected to the replica channel 18 on the CBB 16, which are then connected to the inputs of the oscilloscope 32 for waveform processing and display. To ensure the same signal integrity and crosstalk effect between the calibration step and the BER testing step, the replica channel traces 18 are laid out identically to the double data rate (DDR) buses 34 connected from the DIMM connector 28 to the CPU 20. As an example, there are at least 4 sets of variable replica channels and DDR5 testing channels with trace lengths approximately 1 inch apart.

The oscilloscope 32 includes S-parameter models to reproduce the insertion loss and crosstalk degradation from the CPU package 20, and a reference receiver equalization model including DFE and CTLE to simulate the recovered signal eye seen at internal latches of the CPU 20.

Also shown in FIG. 3 are loopback signals LB_DQ and LB_DQS that are provided to the RX_DQ and RX_DQS channel ports of the BERT 22. It will be appreciated that this approach may slightly increase the cost of the CPU chipset 20 as two additional pins are needed per channel, which would necessitate 16 additional pins for an 8-channel CPU. The transmit TX_DQ and TX_DQS signals from the BERT 22 are connected to the CPU 20 through the CLB 26, DIMM connector 28 and the DDR5 buses on the CBB 16. The signals are delivered to the CPU 20, passed through the receiver equalization units of CTLE and/or DFE, and recovered at the receive latches of the memory controller. Among the four Data signals DQ[0 . . . 3], three of them will be assigned as the aggressors to generate crosstalk noise, and the remaining one will be designated as the victim whose stressed eye waveform will include the crosstalk noise from the aggressor signals.

Figure 11:
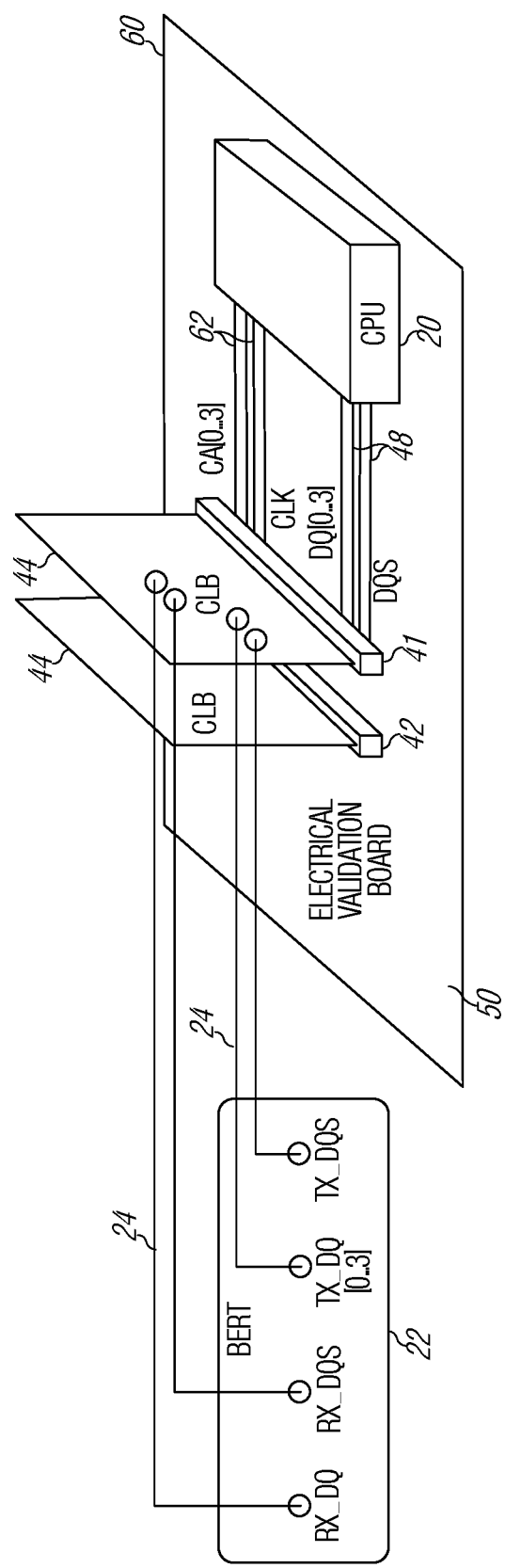
FIG. 11 illustrates the looped back command and address (CA) and Clock signals transmitted through the CA bus to the receive channels of the BER tester, and loopback LB_DQ signals from TX_DQ signals in a sample embodiment.

A feature introduced here for the DDR5 memory controller receiver testing is the loopback path with 2 loopback signals, LB_DQ and LB_DQS. As shown in FIG. 11, the loopback data LB_DQ signal will be an identically duplicated and delayed from the input data signal stream received at the aforementioned victim DQ lane. The LB_DQ and LB_DQS signals are transmitted to the BERT's receive channels, RX_DQ and RX_DQS. The BERT will then compare the received RX_DQ signal to the transmitted TX_DQ signal, and calculate the bit error rate. To conduct this testing, the new loopback path will need to be supported at the memory controller and DDR Phy implementations.

A sample embodiment of the receiver equalization and stressed eye testing method is outlined in the following steps:

1. Calibrate the receiver by adjusting the timing relationships between the TX_DQ and TX_DQS, selecting the replica channels, and stepping through transmitter presets and receiver CTLE to obtain optimal transmitter presents and receiver CTLE combinations.

2. Perform BER testing on the receiver by comparing an injected bit stream with a looped back version of the bit stream.

Figure 4:
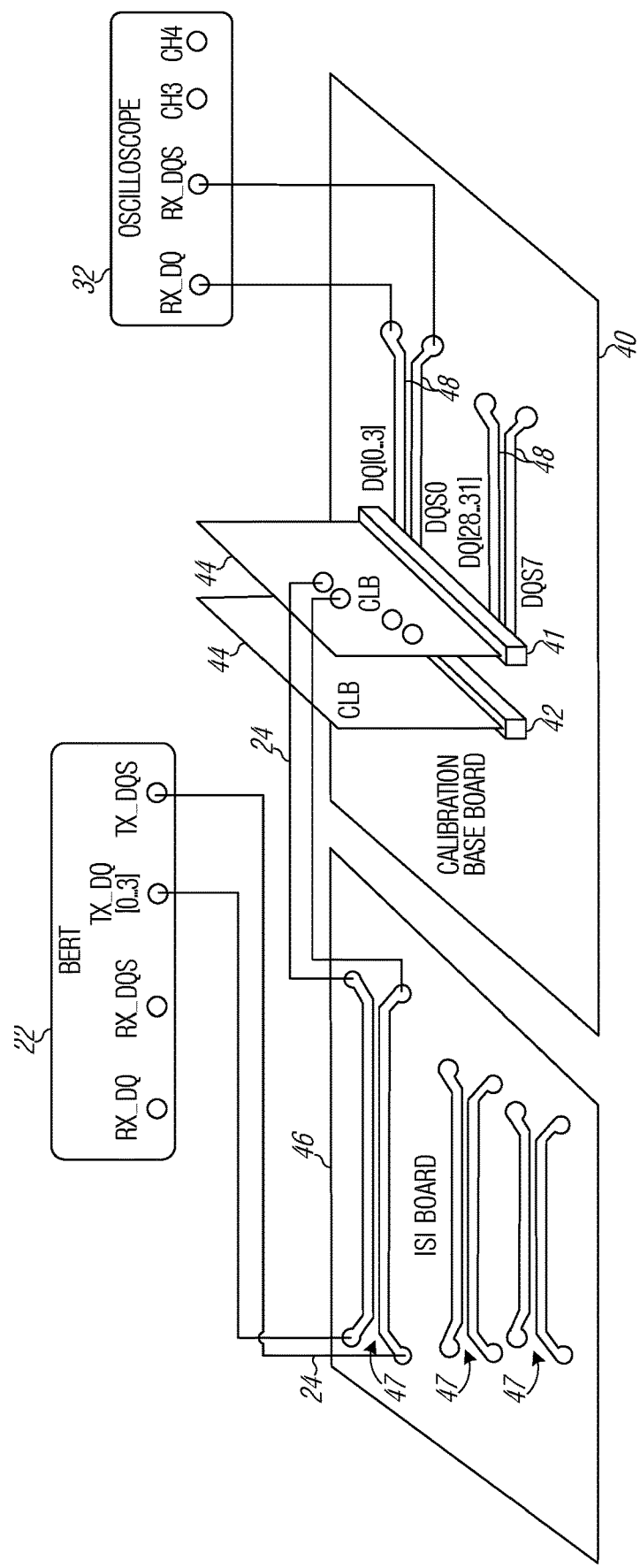
FIG. 4 illustrates a receiver equalization and stressed eye testing method in a sample embodiment.

FIG. 4 illustrates a receiver equalization and stressed eye testing method of a sample embodiment. As illustrated, the method includes a calibration step to determine optimal transmitter preset and receiver CTLE combinations for the CPU 20 at step 40. The method also includes a BER testing step at step 41.

A sample embodiment of the calibration step of the receiver equalization and stressed eye testing method of FIG. 4 is outlined in the following steps:

1. Configure the BERT 22 to transmit DDR5 compliant TX_DQ and TX_DQS signals to the oscilloscope 32. Set the random jitter and sinusoidal jitter levels of the TX signals to nominal values in DDR5 DRAM specs.

2. Tune the timing relationship between TX_DQ and TX_DQS from the BERT 22, to reach the worst-case timing specs as defined by tDQSQ and tQHS parameters in the DDR5 DRAM specifications, or worst-case timing specs as defined by a design specification of the receiver.

3. Configure the BERT 22 to inject noise to the differential DQS and single-ended DQ signals to reach the nominal levels specified by DDR5 DRAM specifications, or nominal levels as defined by the design specification of the receiver.

4. Cycle through the variable replica channels, and select the worst-case channel that can still meet the RX eye mask specification as defined by the memory controller's design target, or RX eye mask specification as defined by DDR5 DRAM specifications.

5. For the selected calibration channel, cycle through the BERT TX de-emphasis preset settings and the Oscilloscope 32 Rx CTLE settings, to obtain the optimal TX preset and RX CTLE combinations. Record the settings for the next BER testing.

6. Make final adjustment on sinusoidal jitter, voltage noise and signal swing levels to reduce the eye width and height at the receiver of the Oscilloscope 32, to reach the closest possible levels to the design target. Record the BERT settings for the next BER testing step.

Figure 5:
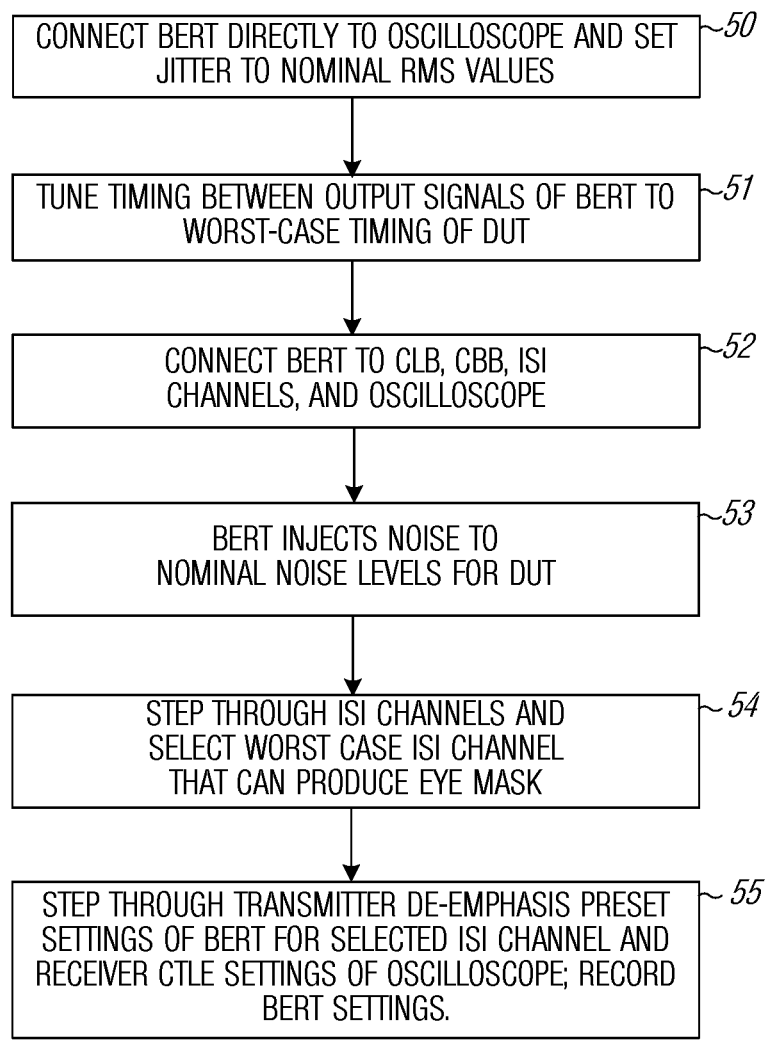
FIG. 5 illustrates a sample embodiment of the calibration step of the receiver equalization and stressed eye testing method of FIG. 4.

FIG. 5 illustrates a sample embodiment of the calibration step of the receiver equalization and stressed eye testing method of FIG. 4. As illustrated, the calibration includes configuring the BERT 22 to transmit TX_DQ signals with nominal root mean squared (RMS) jitter specifications that meet a jitter specification (such as specified by the DDR5 technical specifications or design specifications of the receiver) to the CPU 20 at step 50. The calibration also includes tuning the TX_DQ and TX_DQS signals to meet worst-case timing specifications (such as specified by the DDR5 technical specifications or design specifications of the receiver) at step 51. Noise is injected to the DQ and DQS signals at nominal levels meeting a noise specification (such as specified by the DDR5 technical specifications or design specifications of the receiver) at step 52. At step 53, different replica channels are cycled through to select a replica channel that results in the worst-case stressed eye diagram that still meets a stressed eye specification (such as specified by the DDR5 technical specifications or design specifications of the receiver). Transmitter de-emphasis settings are cycled through to obtain optimal transmitter presets and receiver CTLE combinations at step 54. The calibration further includes adjusting jitter, noise, and swing levels to reduce stress eye characteristics and meet a design target or DDR5 technical specifications if the stressed eye characteristics is greater than the stressed eye specification at step 55.

A sample embodiment of the BER testing step of the receiver equalization and stressed eye testing method of FIG. 4 is outlined in the following steps:

1. Configure the BERT 22 with the jitter, noise and timing settings that derive the worst-case RX eye in the calibration step.
2. Connect the SMA cables from the BERT 22 to the CLB and CBB channel that corresponds to the selected replica channel in the calibration step.
3. Configure the BERT 22 to execute the equalization protocol, and train the receiver (e.g., the DDR5 receiver) to obtain the optimal CTLE and/or DFE tap settings for the given channel.
4. Configure the BERT 22 to place the CPU 20 into loopback mode.
5. Configure the BERT 22 to transmit a data pattern (e.g., a DDR5 data pattern) into the CPU 20, and verify the detected error is within the design specification or the DDR5 technical specifications. For example, at the speed of DDR5-3200 with a requirement of BER<10-12, this implies a continuous transmission of the DDR5 data pattern for a duration of approximately 5 minutes. If there is one or less error detected by the BERT 22 in 5 minutes, the CPU 20 is considered having passed the BER testing.

Figure 6:
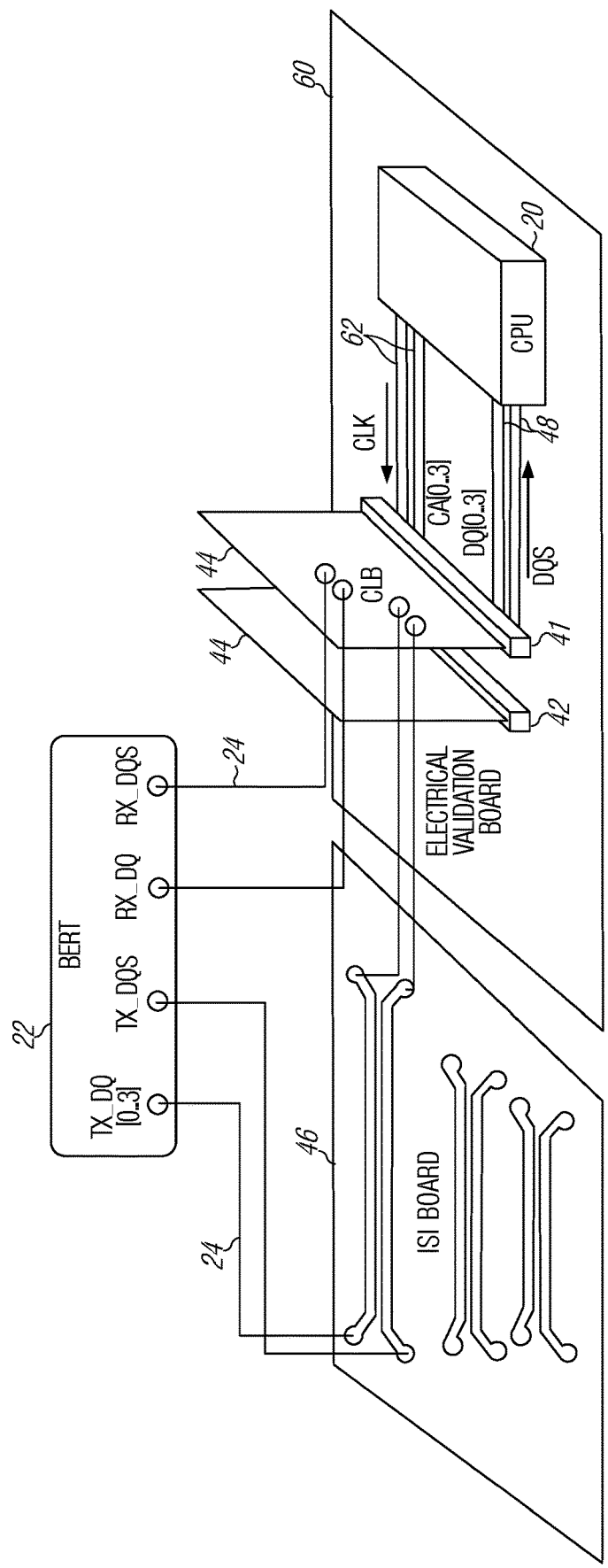
FIG. 6 illustrates a sample embodiment of the BER testing step of the receiver equalization and stressed eye testing method of FIG. 4.

FIG. 6 illustrates a sample embodiment of the BER testing step of the receiver equalization and stressed eye testing method of FIG. 4. As illustrated, BER testing includes configuring the BERT with settings that derive the worst-case stressed eye performance while meeting the stressed eye specifications (such as specified by the DDR5 technical specifications or design specifications of the receiver) at step 60. The CPU 20 is connected to the BERT 22 using the replica channel that resulted in the worst stressed eye diagram that still meets the stressed eye specifications at step 61. At step 62, an equalization protocol is performed. The BER testing also includes training the receiver to obtain optimal CTLE or DFE tap settings for the replica channel at step 63. The BER testing further includes placing the CPU 20 into loopback mode at step 64. A data pattern is transmitted by the BERT 22 to the CPU 20 at step 65, and at step 66, the BERT 22 captures feedback data (the looped back version of the data pattern), determines the BER, and verifies that the BER meets the BER specification (such as specified by the DDR5 technical specifications or design specifications of the receiver).

As was detailed previously, there is no existing testing methodology in the current DDR4 system that can conduct BER testing. BER testing is becoming the new standard of electrical and compliance testing for the upcoming DDR5 DRAM. The BER testing for DDR5 memory controller is supported by the new testing system and method presented herein.

Furthermore, the existing testing and validation systems use the DDR4 DRAM devices as the signal generator to test the receiver of the memory controller. The DRAM devices generally do not have the capability to control the amount of jitter, noise and timing skews of the signals coming out of them, and thus lead to significant variability of signals received by the CPU. Hence, they are not able to provide a stressed eye that stretches the boundary of the electrical signals to the eye mask specifications by the memory controller design target. In the disclosed sample embodiments, however, the BERT is employed to generate the stressed data signal that can control the exact eye diagrams seen at the memory controller receiver, and correlate them to the design target.

In sample embodiments, an electrical testing system and method for DDR5 system board and memory controller receiver equalization is provided and the detailed testing flow is defined. A two-step approach includes a step of calibration and a step of BER testing. In comparison with the testing systems and methods described above with respect to FIGS. 2-3, the system and method described herein does not require a dedicated calibration base board (CBB) with replica channels. In addition, the system and method described herein saves CPU pins by providing an option to loopback the signals through existing command and address (CA), Clock buses, and other buses including Command, Control, Data, Response, and other output pins to the calibration base board. Also, an inter-symbol interference (ISI) board provides additional signal degradation to facilitate the receiver equalization test.

In sample embodiments, the electrical testing system utilizes standard sets of a CLB and a CBB without a customized replica channel for the calibration of the stressed eye, and then uses the existing EVB for the CPU to conduct the BER testing. Therefore, no new hardware is needed. Also, an option is provided to use the existing CA and Clock signals (and alternatively the Command, Control, Data, Response, and other output pins) to loop back the received data signals, thereby eliminating the need for new loopback signals, LB_DQ and LB_DQS. Also, an option to use ISI channels with various lengths is provided to increase the flexibility for providing various levels of signal degradation for the receiver equalization test.

Figure 7:
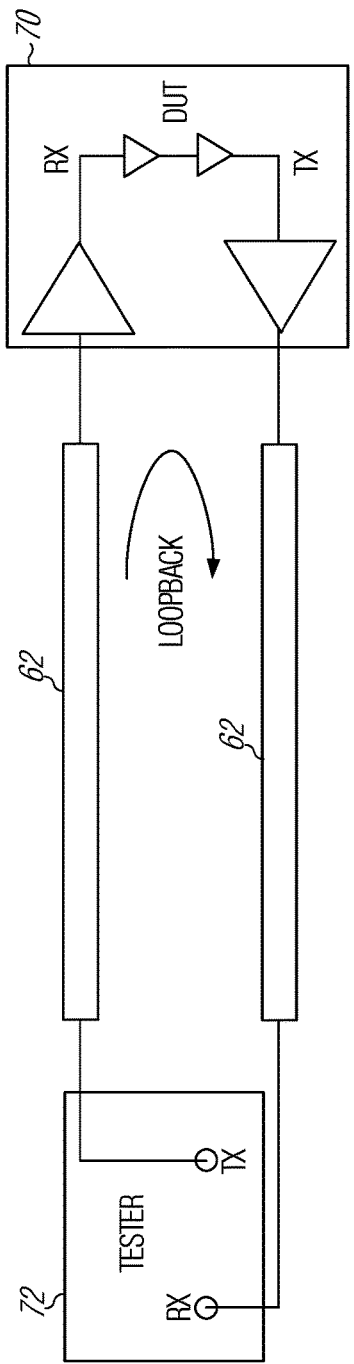
FIG. 7 illustrates receiver equalization testing methodology for a fifth-generation double data rate (DDR5) system board and memory controller for calibration in a sample embodiment.

The receiver equalization testing methodology for a DDR5 system board and memory controller includes two steps, a calibration step and a BER testing step. The setup for the calibration step is demonstrated in FIG. 7. As illustrated in FIG. 7, the calibration setup includes a CBB 70, which is a mother board with DIMM sockets 72 that connect to testing equipment. It is noted that the CBB 70 is not the same as the Calibration Base Board 16 of the embodiment of FIG. 2 and FIG. 3 as, for example, no replica channel is provided and the CBB 70 may be used for different products to be tested, without modification. A CLB 74, which is a testing card with similar form factor to a DDR5 DIMM, is inserted into a DIMM socket 72 of the CBB 70. An ISI board 76 is also provided. The ISI board 76 has various trace lengths 77 for DQ and DQS in order to create means for providing different delay and ISI effects. The ISI Board 76 connects the CLB 74 to the BERT 22, which is a high-capacity high-speed tester that generates a stressed eye signal with controlled error and noise and receives the looped back signal for BER measurement. A high-speed real-time oscilloscope 32 with built-in S-parameter embedding and de-embedding features and equalization features for DDR5 is connected to the DQ bus 78 on the CBB 70 as illustrated.

The BERT 22 is used as the signal generator to drive and transmit DDR5 DQ and DQS signals into the SMA cable 24, which is connected through the ISI board 76 to the CLB 74. The transmit (TX) channel of the BERT 22 includes a minimum of one differential pair of TX_DQS signals, and four single-ended TX_DQ[0 . . . 3] signals. This will be sufficient to test the x4 DDR5 interface including a crosstalk effect. Optionally, the TX channel of the BERT 22 can be expanded to 8 single-ended signals including TX_DQ[0 . . . 7], plus the differential TX_DQS signals, in order to provide full testing capability for the x8 DDR5 interface. The BERT 22 also has receive channels including the RX_DQ and RX_DQS signals in order to support the loopback testing, as will be described below.

The ISI board 76 has a wide range of trace lengths 77 for DQ and DQS to create various delay, loss and inter-symbol interference effects for the DQ and DQS signals. The CLB 74 has the same pin-out as the standard DDR5 RDIMM, and is inserted into the DDR5 RDIMM connector socket 71 on the CBB 70. Another CLB 74, or a dummy DIMM card is inserted into a non-driving DIMM socket 72, to provide any necessary termination and signal distortion to the transmit signals from the BERT 22. The testing and calibration should cover both cases where the CLB 74 is placed in the DIMM socket 71 near the oscilloscope 32 and the DIMM socket 72 far from the oscilloscope 32 (see FIG. 7). For the testing of one DIMM per channel, the DIMM socket 71 is unpopulated and the CLB 74 is inserted into the DIMM socket 72, for example.

For the calibration step, the CLB 74 is inserted into the CBB 70, which is connected to the inputs of oscilloscope 32 through DQ bus 78 for waveform processing and display. The oscilloscope 32 has embedded S-parameter models to embed and to reproduce the insertion loss and crosstalk degradation from the EVB traces, the CPU package, and a reference receiver equalization model including decision feedback equalization (DFE) and continuous time linear equalization (CTLE) to simulate the recovered signal stressed eye seen at internal latches of the CPU 20. In addition, the oscilloscope 32 also has the ability to de-embed the insertion loss effect of the traces 78 of the CBB 70.

The calibration procedure is outlined in the following steps:

1. Connect the TX channels of the BERT 22 directly to the input of the oscilloscope 32 through SMA cables 24. The BERT 22 then transmits DDR5 compliance TX_DQ and TX_DQS signals to the oscilloscope 32. The random jitter and sinusoidal jitter levels of the TX signals are set to the nominal RMS jitter specifications as defined in DDR5 DRAM specifications.

2. Calibrate the timing relationship between TX_DQ and TX_DQS from the BERT 22 to reach the worst-case timing specifications as defined by tDQSQ and tQHS parameters in the DDR5 DRAM specifications. Note that calibration steps 1 and 2 should directly connect the output of the BERT 22 to the input of the oscilloscope 32 without going through the testing fixtures.

3. Connect the BERT 22 and the oscilloscope 32 with the ISI board 76, CLB 74, and CBB 70 as shown in FIG. 7. The BERT 22 then injects noise to the differential DQS and single-ended DQ signals to the nominal noise levels specified by DDR5 DRAM specifications.

4. Step through the various ISI channels 77 and select the worst-case ISI channel 77 that can still meet the receiver (RX) stressed eye mask specification as defined by the memory controller's design target.

5. For the selected ISI calibration channel, step through the TX de-emphasis preset settings of the BERT 22 and the RX CTLE settings of the oscilloscope 32 to obtain the optimal TX preset an RX CTLE combinations. Record the settings for the BER testing.

6. If the eye width and height of the obtained stressed eye signal is still greater than the stressed eye mask specified by the memory controller design target, make a final adjustment on sinusoidal jitter, voltage noise and signal swing levels to reduce the eye width and height at the receiver of oscilloscope 32 to reach the closest possible levels to the design target. Record the BERT settings for the next BER testing step.

Figure 8:
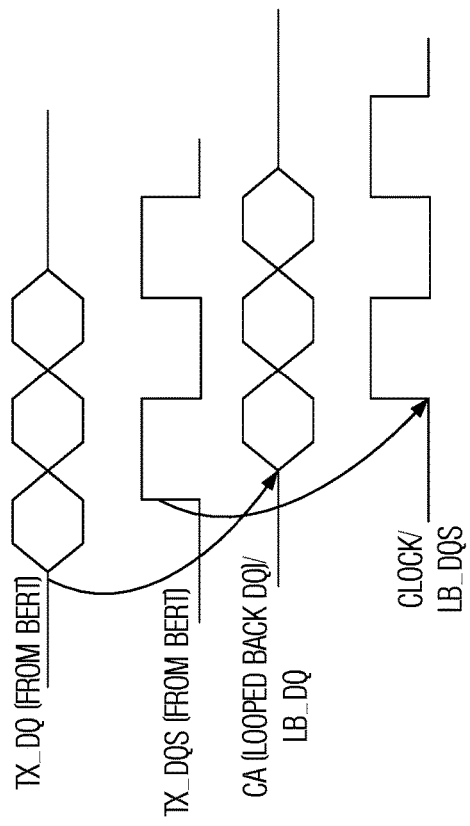
FIG. 8 illustrates the calibration method of a sample embodiment.

FIG. 8 illustrates the calibration method of a sample embodiment. As illustrated, the calibration method includes connecting a transmit channel of the BERT 22 directly to an input of the oscilloscope 32 through SMA cables 24 and setting random jitter and sinusoidal jitter levels of transmit signals from the BERT 22 to nominal RMS values at step 80. A timing relationship between output transmit signals of the BERT 22 is tuned to worst-case timing specifications for the device under test (e.g. CPU 20) at step 81. The BERT 22 is connected to CLB 74 that is connected to DQ bus 78 of the CBB 74 and ISI channels, and the DQ bus 78 of the CBB 74 are connected to the oscilloscope 32 at step 82. The BERT 22 injects noise to nominal noise levels for differential DQS signals and DQ signals for the device under test at step 83 and then steps through various ISI channels and selects a worst-case ISI channel that can produce a stressed eye mask specification for the device under test at step 84. For the selected ISI channel, the calibration method concludes at step 85 by stepping through transmitter de-emphasis preset settings of the BERT 22 and receiver CTLE settings of the oscilloscope 32 to obtain an optimal transmitter preset and recording the settings of the BERT 22 for use during the testing phase.

The calibration procedures for the receiver equalization testing are now completed and a stressed eye signal is created at the receiver end. The final settings of the BERT 22 can be used for the BER testing.

Figure 9:
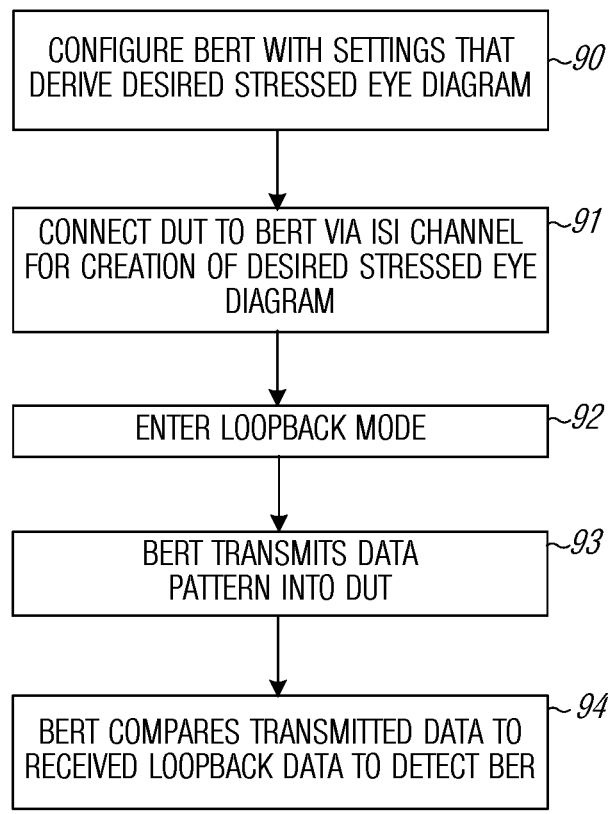
FIG. 9 illustrates the measurement setup for the DDR5 system board and memory controller receiver for BER testing in a sample embodiment.

FIG. 9 illustrates the measurement setup for the DDR5 system board and memory controller receiver for BER testing in a sample embodiment. As illustrated, the CLB 74 is now inserted into the EVB 90 of the CPU 20. The transmit TX_DQ and TX_DQS signals from the BERT 22 are transmitted to the EVB 90 through the ISI board 76, SMA cables 24, and CLB 74. The signals will go through the package traces of the CPU 20, amplified by the differential receivers of the DDR physical layer, passed through the receiver equalization units of CTLE and DFE, and recovered at the receive latches of the memory controller of the CPU 20. Among the four data signals DQ[0 . . . 3] in a sample configuration, three of them will be assigned as the aggressors to generate crosstalk noise, and the remaining one will be designated as the victim. Therefore, stressed eye waveform of the victim signal will include the crosstalk noise from the aggressor signals.

Figure 10:
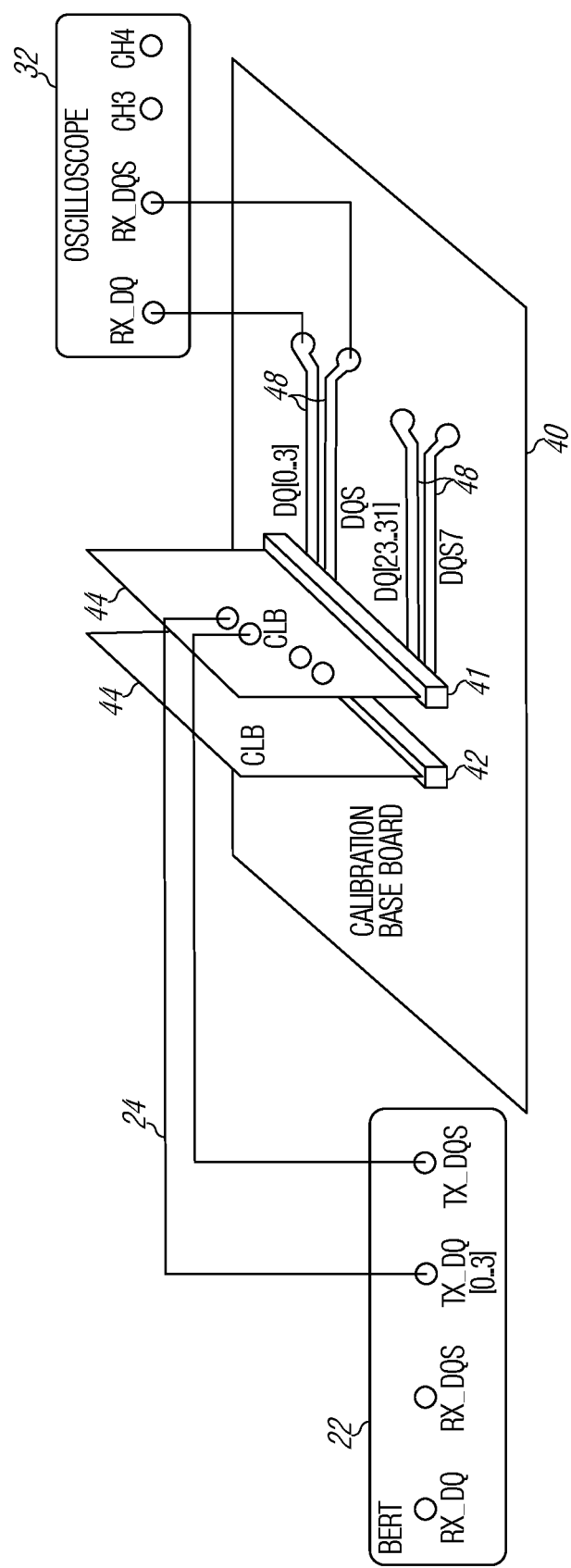
FIG. 10 illustrates a loopback test with an external tester for a device under test (DUT) in a sample embodiment.

A new feature introduced for the DDR5 memory controller receiver equalization testing herein is that the received signals will be looped back and transmitted over the existing CA and Clock bus 62, as shown in FIG. 9 and more particularly in FIG. 10. A loopback feature is a function for a device under test (DUT) 100 to receive the input data from an external tester 102 or an internal unit, pass it through its internal paths and gates, and transmit the identical data from its transmitter port back to the tester or the internal unit. The tester 102 or the internal unit will have the capability to compare the transmitted data back from the DUT 100 to the original data it sends to the DUT 100, and calculate the error rate. The goal of the loopback test is to validate that the receiver and transmitter of the DUT 100 can work appropriately and are able to loopback the data correctly and in a timely fashion.

FIG. 10 illustrates the loopback test with an external tester 102 for DUT 100.

The loopback scheme of FIG. 10 has the advantage of saving additional LB_DQ and LB_DQS pins. The looped back CA signals are identically duplicated and delayed from the input data signal stream received at the aforementioned victim DQ lane. The looped back CA and Clock signals are transmitted through the CA and Clock bus 92 to the receive channels of the BERT 22. Alternatively, the looped back signals may be sent via Command, Control, Data, Response, and other output pins from the CPU 20. As illustrated in FIG. 11, the transmitted TX_DQ and TX_DQS signals from the BERT 22 are looped back as RX_DQ on the CA bus 92 along with the clock signal (Clock). The BERT 22 will then compare the received RX_DQ signal to the transmitted TX_DQ signal, and calculate the bit error rate. To conduct this testing, the new loopback path is supported by the memory controller and DDR physical layer implementations of the CPU 20.

With loopback, a DDR5 device can feed a received signal or data back out to an external receiver for multiple purposes. Loopback allows the host (memory controller or test instrument) to immediately read back data that was just sent to the DRAM without having to issue multiple WRITE/READ commands. Loopback in a DDR5 DRAM requires that the data be sent to the loopback path before sending it to the core so no READ/WRTE commands are required for loopback to be operational. There are also inherent limitations when characterizing the receiver using statistical analysis methods such as BER analysis. For example, at BER=1E-16 there is not enough memory depth in the DRAM to store all the data. Also, the amount of time to perform multiple WRITE/READ commands to/from the memory is prohibitively long. Since the amount of time involved performing these operations is much longer than the DRAM refresh rate interval, the host or memory controller also manages refreshes during testing to ensure data retention. In addition, limited pattern depth means limited ISI and limited Random Jitter (Rj), and, therefore, limited errors at the receiver. Use of the loopback feature is thus desirable for characterizing the receiver without the limitations and complexities of other traditional validation methods. Loopback can also be used during "normal" operation, i.e., during training and when an operating system is loaded.

The BER testing procedure can be summarized into the following steps:

1. Configure the BERT 22 with the jitter, noise and timing settings that derive the worst-case RX stressed eye in the calibration step, in which the RX stressed eye diagram should meet and most closely match the stressed eye mask specification of the design target.

2. Connect the SMA cables 24 from the BERT 22 to the CLB 74 and ISI channel 77 on the ISI board 76 that corresponds to the selected channel in the calibration step.

3. Have the BERT 22 run the equalization protocol, and train the DDR5 memory controller receiver to obtain the optimal CTLE and/or DFE tap settings for the given channel. As known to those skilled in the art, the "equalization protocol" involves stepping through the transmitter preset settings and the receiver CTLE and DFE settings to obtain the optimal receiver/transmitter equalization combinations for the given channel.

4. Have the BERT 22 put the CPU 20 into loopback mode, so that the looped back data is transmitted on the CA bus 92 back to the CLB 74. Optionally, the looped back signals may be transmitted through other existing ports or dedicated pins of LB_DQ and LB_DQS of the CPU 20, if available.

5. Have the BERT 22 transmit the DDR5 data pattern as described in the JEDEC DDR5 specification into the CPU 20 and verify the detected bit error rate is within the design specification. For example, at the speed of DDR5-3200 with a requirement of BER<10-12, this implies a continuous transmission of data through a duration of approximately 5 minutes. If there is one or less error detected by the BERT 22 in 5 minutes, the CPU 20 is considered as having passed the BER testing.

Figure 12:
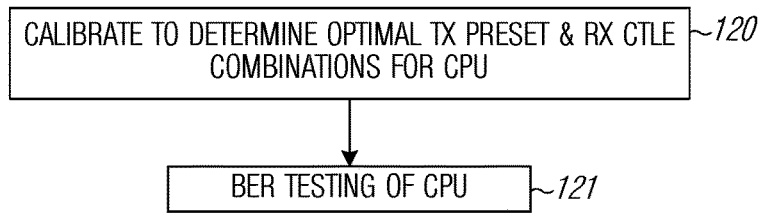
FIG. 12 illustrates the testing method of a sample embodiment.

FIG. 12 illustrates the testing method of a sample embodiment. As illustrated, the testing method includes configuring the BERT 22 with the DDR5 data pattern with injected noise and jitter that derives a desired receiver stressed eye diagram at step 120. In a sample embodiment, configuring the BERT 22 includes running an equalization protocol to train the DUT 100 to obtain at least one of an optimal DFE tap setting and an optimal CTLE tap setting for the ISI channel. The DUT 100 is then connected to the BERT 22 via an ISI channel that introduces delays for creation of the desired receiver stressed eye diagram at step 121. The BERT 22 then places the DUT 100 into a loopback mode whereby data transmitted to the DUT 100 by the BERT 22 is transmitted back to the BERT 22 for comparison to the data transmitted to DUT 100 at step 122. At step 123, the BERT 22 transmits a data pattern into the DUT 100, and the BERT 22 then compares the data transmitted to DUT 100 to data received back from the DUT 100 during the loopback mode to detect the bit error rate at step 124.

Figure 13:
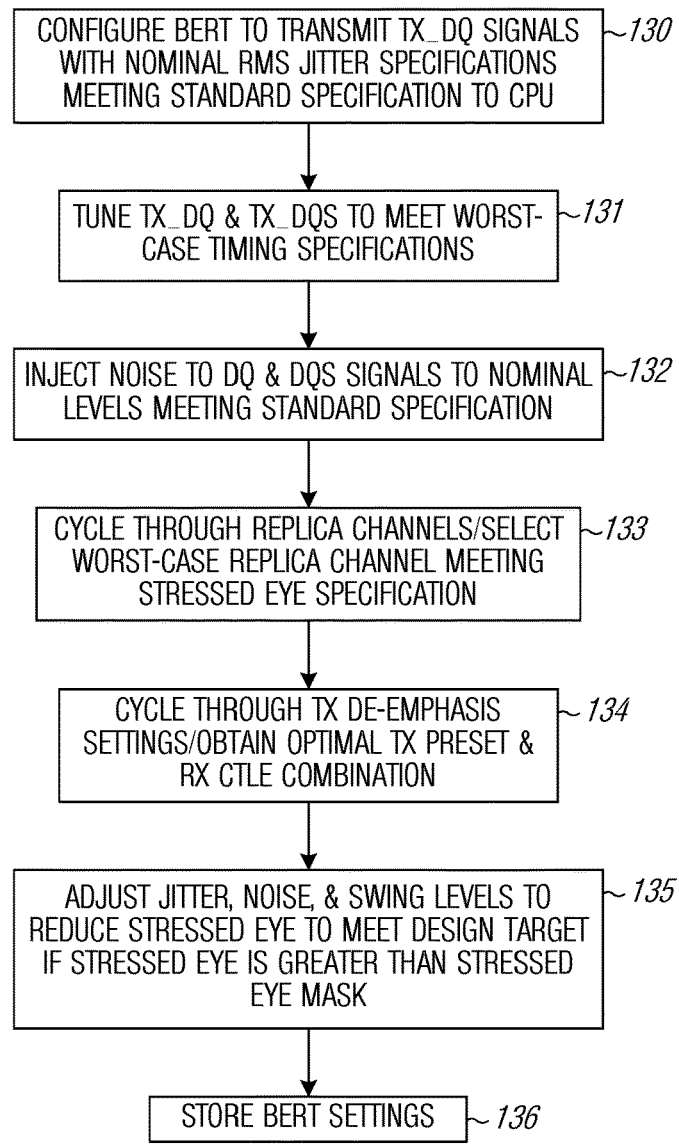
FIG. 13 illustrates another embodiment of the receiver equalization calibration setup without the inter-symbol interference (ISI) board of the embodiment of FIG. 4.
Figure 14:
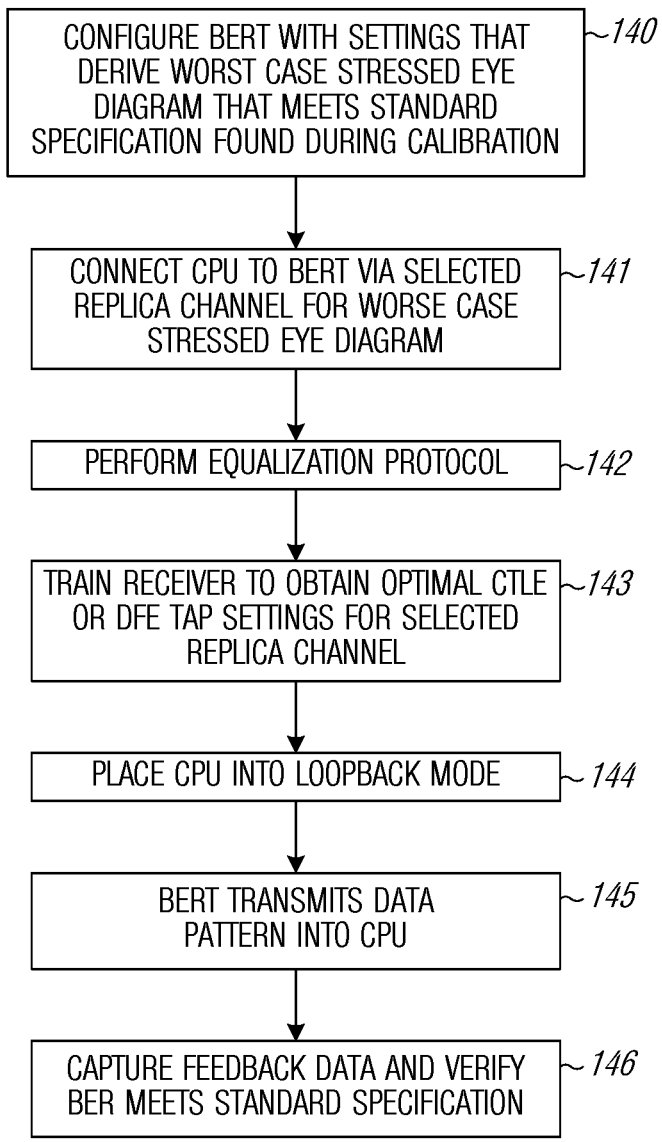
FIG. 14 illustrates another embodiment of the receiver equalization BER testing setup without the ISI board of the embodiment of FIG. 6.

FIG. 13 (receiver equalization calibration setup) and FIG. 14 (receiver equalization BER testing setup) demonstrate an alternative system implementation scheme to conduct the DDR5 system board and memory controller receiver equalization testing, which performs the calibration and BER testing steps without the ISI board 76. In this case, the ISI board 76 is removed and the TX_DQ and TX_DQS jitter/noise signals from the BERT 22 are directly fed into the CLB 74 as illustrated. The various trace lengths are instead implemented in the CBB 70 and EVB 90 by varying the length of the DQ bus 78. It will be appreciated by those skilled in the art that a wide range of trace lengths of DQ bus 78 are needed on the CBB 70 and EVB 90 to provide the means for providing different delay and ISI effects for imposing necessary insertion loss and attenuation to the DDR5 signals. Thus, this requirement may be found overly stringent in some applications where the EVB 90 is required to closely match the real product board and customer reference board.

Those skilled in the art will appreciate that the systems and methods described herein provide a detailed electrical testing setup and procedures to conduct receiver link equalization testing for the DDR5 system board and memory controller. A loopback function is further provided that transmits the received signals back through existing CA and Clock buses (or alternatively via Command, Control, Data, Response, and other output pins), thereby saving pins otherwise required for LB_DQ and LB_DQS signals. The testing system also uses standard testing equipment and fixtures for the BERT 22, ISI board 76, CBB 70, and CLB 74 to help calibrate and generate the worst-case stressed eye signals without requiring unique or proprietary layouts for different devices under test or during calibration. The DDR5 receiver equalization testing is instead performed for any CPU EVB 90 without the need for additional hardware. The CBB 70, CLB 74, and ISI boards 76 are standard fixtures and can be reused for multiple projects.

Those skilled in the art will appreciate that the system described herein provides many technical advantages over conventional systems. For example, there is no existing testing method in the current DDR4 memory system that can conduct receiver equalization and BER testing, which is becoming the new standard of electrical and compliance testing for the upcoming DDR5 DRAM. The systems and methods described herein define a testing system solution and methodology that supports the receiver equalization and BER testing for a DDR5 system board and memory controller. Also, compared to previous solutions, the systems and methods described herein eliminate the need for a dedicated base board with a replica channel and utilizes a set of standard testing fixtures that can be reused across multiple platforms and products, significantly reducing costs. Also, an inter-symbol interference board with various trace lengths is introduced to provide a wide range of insertion loss and signal attenuation to help facilitate the creation of worst-case stressed eye signals at the receiver end. An alternative system and method are described for implementing the various trace lengths on the base boards. Finally, a loopback path is introduced that sends out the received data signals and transmits the looped back signals through the existing CA and Clock buses (or alternatively via Command, Control, Data, Response, and other output pins), which saves the cost of adding additional LB_DQ and LB_DQS pins to the CPU.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

The computer-readable non-transitory media includes all types of computer readable media, including magnetic storage media, optical storage media, and solid state storage media and specifically excludes signals. It should be understood that the software can be installed in and sold with the device. Alternatively the software can be obtained and loaded into the device, including obtaining the software via a disc medium or from any manner of network or distribution system, including, for example, from a server owned by the software creator or from a server not owned but used by the software creator. The software can be stored on a server for distribution over the Internet, for example.

The terminology used herein is for the purpose of describing particular aspects only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The aspects of the disclosure herein were chosen and described in order to best explain the principles of the disclosure and the practical application, and to enable others of ordinary skill in the art to understand the disclosure with various modifications as are suited to the particular use contemplated.

For purposes of this document, each process associated with the disclosed technology may be performed continuously and by one or more computing devices. Each step in a process may be performed by the same or different computing devices as those used in other steps, and each step need not necessarily be performed by a single computing device.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A method for bit error rate testing a processing unit using a bit error rate tester (BERT), the method comprising:
    transmitting, by the BERT, a signal pair to a receiver of the processing unit, the signal pair having jitter levels complying with a jitter threshold;
    tuning, by the BERT, the signal pair to obtain a first stressed eye measurement for the receiver based on the signal pair transmitted, wherein the first stressed eye measurement complies with a stressed eye mask, and wherein the BERT is calibrated based on the first stressed eye measurement obtained from the tuning;
    after the BERT is calibrated:
        placing, by the BERT, the processing unit into a loopback mode;
        transmitting, by the BERT, a data pattern to the processing unit;
        receiving, by the BERT, a looped back version of the data pattern from the processing unit; and
        calculating, by the BERT, a bit error rate in accordance with the data pattern and the looped back version of the data pattern.

2. The method of claim 1, further comprising:
    comparing, by the BERT, the bit error rate with a bit error rate threshold; and
    determining, by the BERT, that the bit error rate is less than the bit error rate threshold, and based thereon, determining that the processing unit passed the bit error rate testing.

3. The method of claim 2, wherein the bit error rate threshold is specified by a fifth generation double data rate (DDR5) synchronous dynamic random access memory (SDRAM) technical standard.

4. The method of claim 1, wherein the tuning the signal pair comprises:
    tuning a timing relationship between a first signal and a second signal of the signal pair to meet a worst-case timing threshold.

5. The method of claim 4, wherein the tuning the signal pair further comprises:
    injecting, by the BERT, noise to the first signal and the second signal until a nominal noise threshold is met.

6. The method of claim 4, wherein the tuning the signal pair further comprises:

activating, by the BERT, a replica channel of a plurality of replica channels;
determining, by the BERT, a second stressed eye measurement for the receiver and the replica channel activated by the BERT;
repeating the activating and the determining for remaining replica channels of the plurality of replica channels; and
selecting, by the BERT, a second replica channel associated with the second stressed eye measurement that most closely complies with, but does not exceed, the stressed eye mask.

7. The method of claim 4, wherein the first signal comprises a data signal and the second signal comprises a data strobe signal.

8. The method of claim 1, further comprising saving, by the BERT, BERT settings and continuous time linear equalization (CTLE) settings of the receiver after the tuning the signal pair.

9. The method of claim 1, further comprising:
performing, by the BERT, an equalization protocol; and
training, by the BERT, the receiver to obtain optimal CTLE settings.

10. The method of claim 1, wherein calculating the bit error rate comprises:
comparing, by the BERT, the data pattern with the looped back version of the data pattern;
determining, by the BERT, that corresponding bits of the data pattern and the looped back version of the data pattern differs, and based thereon, incrementing an error count; and
generating, by the BERT, the bit error rate in accordance with the error count and a number of bits in the data pattern.

11. A system for bit error rate testing a processing unit using a bit error rate tester (BERT), the system comprising:
an electrical validation board having data traces adapted to connect to a receiver of the processing unit and a transmitter of the processing unit;
a calibration load board adapted to connect to the data traces of the electrical validation board, the calibration load board further adapted to connect to the BERT to receive a data pattern with jitter and noise injected from the BERT, the data pattern transmitted to the processing unit via the calibration load board and via the data traces, and a looped back version of the data pattern transmitted back from the processing unit to the BERT via the data traces and the calibration load board for calculation of a bit error rate; and
a measurement device adapted to connect to the data traces and to make stressed eye measurements.

12. The system of claim 11, wherein the data pattern is provided to the processing unit via the data traces of the electrical validation board having varied lengths to provide different delay and inter-symbol interference effects.

13. The system of claim 11, wherein the data traces of the electrical validation board have varied lengths.

14. A system for bit error rate testing of a processing unit, the system comprising:
an electrical validation board having data traces adapted to connect to a receiver of the processing unit and a transmitter of the processing unit;
a calibration load board adapted to connect to the data traces of the electrical validation board, the calibration load board further adapted to connect to a tester to receive a data pattern with jitter and noise injected from the tester, the data pattern transmitted to the processing unit via the calibration load board and via the data traces and a looped back version of the data pattern transmitted back from the processing unit to the tester via the data traces and the calibration load board for calculation of a bit error rate;
a non-transitory memory storage comprising instructions; and
one or more processors of the tester in communication with the non-transitory memory storage, the electrical validation board, and the calibration load board, wherein the one or more processors execute the instructions to:
transmit a signal pair to the receiver of the processing unit, the signal pair having jitter levels complying with a jitter threshold,
tune the signal pair to obtain a first stressed eye measurement for the receiver based on the signal pair transmitted, wherein the first stressed eye measurement complies with a stressed eye mask, and wherein the tester is calibrated based on the first stressed eye measurement obtained from the tuning,
after the tester is calibrated:
place the processing unit into a loop-back mode,
transmit the data pattern to the processing unit,
receive the looped back version of the data pattern from the processing unit, and
calculate the bit error rate in accordance with the data pattern and the looped back version of the data pattern.

15. The system of claim 14, wherein the one or more processors further execute the instructions to compare the bit error rate with a bit error rate threshold, and determine that the bit error rate is less than the bit error rate threshold, and based thereon, determining that the processing unit passed the bit error rate testing.

16. The system of claim 14, wherein the one or more processors further execute the instructions to tune a timing relationship between a first signal and a second signal of the signal pair to meet a worst-case timing threshold.

17. The system of claim 16, wherein the one or more processors further execute the instructions to inject noise to the first signal and the second signal until a nominal noise threshold is met.

18. The system of claim 16, wherein the one or more processors further execute the instructions to perform operations of:
activating a replica channel of a plurality of replica channels,
determining a second stressed eye measurement for the receiver and the replica channel,
repeating the activating and the determining for remaining replica channels of the plurality of replica channels, and
selecting a second replica channel associated with the second stressed eye measurement that most closely complies with, but does not exceed, the stressed eye mask.

19. The system of claim 14, wherein the one or more processors further execute the instructions to perform an equalization protocol, and train the receiver to obtain optimal CTLE settings.

20. The system of claim 14, wherein the one or more processors further execute the instructions to compare the data pattern with the looped back version of the data pattern, determine that corresponding bits of the data pattern and the looped back version of the data pattern differs, and based thereon, incrementing an error count, and generate the bit error rate in accordance with the error count and a number of bits in the data pattern.

\* \* \* \* \*